United States Patent
Pascucci

[19]

[11] Patent Number: 5,903,166
[45] Date of Patent: May 11, 1999

[54] CIRCUIT FOR IMMUNIZING AN INTEGRATED CIRCUIT FROM NOISE AFFECTING ENABLE SIGNALS OF THE INTEGRATED CIRCUIT

[75] Inventor: Luigi Pascucci, Sesto San Giovanni, Italy

[73] Assignee: SGS-Thomson Microelectronics S.r.l., Argate Brianza, Italy

[21] Appl. No.: 08/811,548

[22] Filed: Mar. 4, 1997

[51] Int. Cl.[6] .............................. H03K 17/16; G11C 7/00

[52] U.S. Cl. ......................... 326/56; 326/21; 365/189.05

[58] Field of Search .......................... 326/21–23, 82–83, 326/56–58; 365/189.05; 327/34, 379, 391

[56] References Cited

U.S. PATENT DOCUMENTS

| | | | |
|---|---|---|---|
| 5,278,789 | 1/1994 | Inoue et al. | 365/189.05 |
| 5,295,117 | 3/1994 | Okada | 365/189.05 |
| 5,440,511 | 8/1995 | Yamamoto et al. | 365/189.05 |

*Primary Examiner*—Jon Santamauro
*Attorney, Agent, or Firm*—Wolf, Greenfield & Sacks, P.C.

[57] ABSTRACT

Circuit for immunizing an integrated circuit from noise affecting external enable signals of the integrated circuit generated during switching of circuit blocks internal to the integrated circuit, comprising first means for detecting a switching of said circuit blocks and for driving second means for forcedly activating internal enable signals of the integrated circuit depending on said external enable signals, in order to forcedly maintain said internal control signals activated during said switching of said circuit blocks.

27 Claims, 5 Drawing Sheets

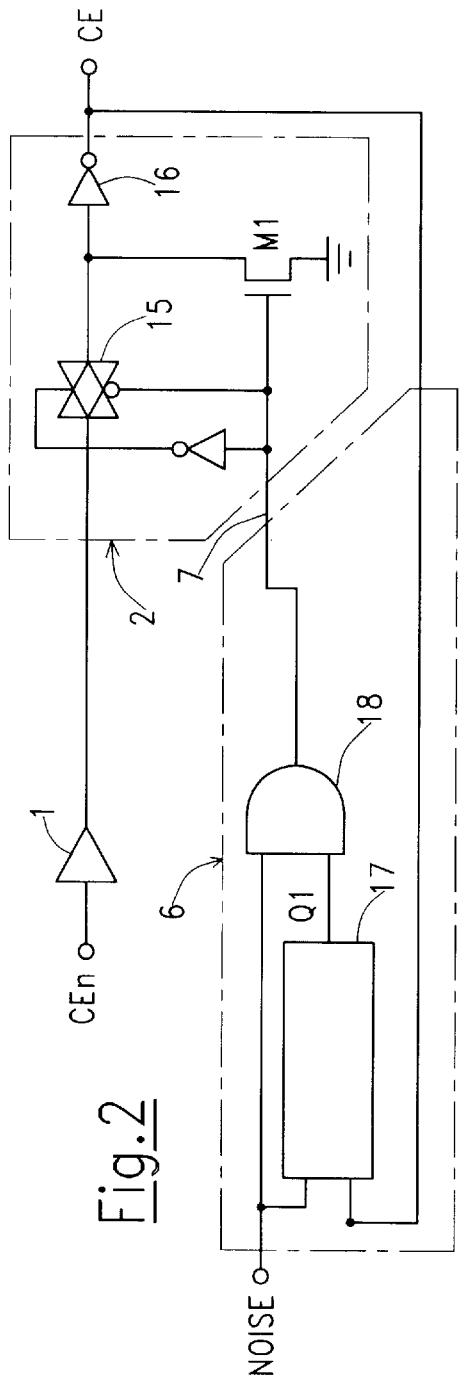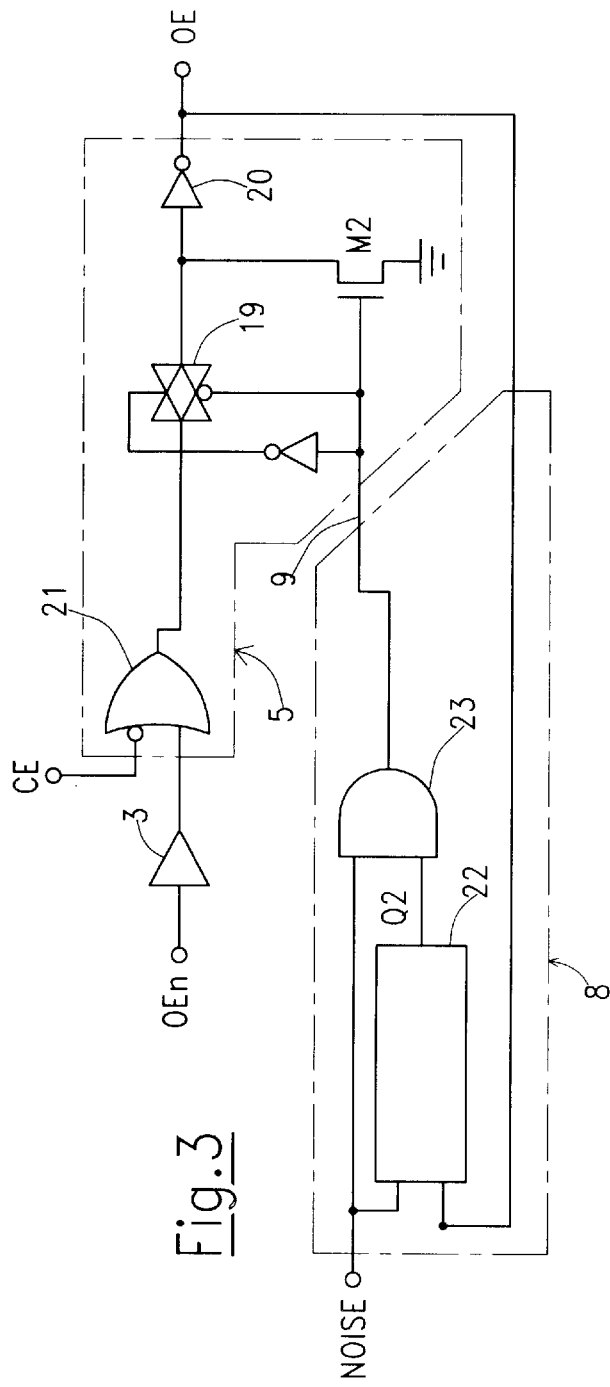
Fig.2
Fig.3

5,903,166

CIRCUIT FOR IMMUNIZING AN INTEGRATED CIRCUIT FROM NOISE AFFECTING ENABLE SIGNALS OF THE INTEGRATED CIRCUIT

FIELD OF THE INVENTION

The present invention concerns a circuit for immunizing an integrated circuit from noise affecting enable signals of the integrated circuit. More particularly, the invention relates to a circuit integratable in more complex integrated circuits, particularly but not exclusively, memory devices such as ROMs, EPROMs, EEPROMs and Flash EEPROMs, in order to immunize said integrated circuits from spurious fluctuations of the logic levels of enable/disable signals of the integrated circuits, or some circuit blocks thereof, fluctuations which take place during switching of said circuit blocks, or of other circuit blocks belonging to the integrated circuits to be immunized.

BACKGROUND OF THE INVENTION

It is known that integrated circuits are generally provided with terminals for external control signals which allow one to enable/disable the integrated circuits, or some circuit blocks thereof, for example in order to put the integrated circuits in a low power consumption mode ("stand-by"), or in order to allow that shared resources of an electronic system are assigned to different integrated circuits.

For example, in memory devices, and particularly in the non-volatile ones such as ROMs, EPROMs, EEPROMs and Flash EEPROMs, two control terminals are generally provided: a terminal for enabling the whole device (universally named CEn), and a terminal for enabling the output data buffers (named OEn). The former is used to put the whole device in said low power consumption operating mode (stand-by), and the latter is used to put the output data buffers in a high output impedance condition, so that an external data bus can be assigned to other devices which share the same.

It is also known that one of the most important aspects of integrated circuits design, and particularly of memory devices, is that related to noise affecting the supply and reference voltages. In the case of memory devices, with the increase of their speed and the number of output data lines, the output data buffers switching at the end of a read operation to transfer the read data to the external data bus cause variations of the supply and reference voltage levels. In fact, due to the current sunk by the output data buffers the supply voltage falls below its nominal value, and the reference voltage rises over its nominal value.

This affects the logic levels of the control signals which are supplied to the control terminals of the integrated circuit, and undesired disabling of the output data buffers or even of the whole integrated circuits can occur. This obviously compromises the correct working of the integrated circuit in the electronic system to which it belongs.

SUMMARY OF THE INVENTION

In view of the state of the art described, it is an object of the present invention to provide a circuit suitable for immunizing an insulated circuit wherein it is integrated from possible variations of the levels of the external control signals of the integrated circuit, caused by noise affecting the supply and the reference voltages due to switching of some circuit blocks of the integrated circuit.

According to the present invention, such object is attained by means of a circuit for immunizing an integrated circuit from noise affecting external enable signals of the integrated circuit, said noise generated during switching of circuit blocks internal to the integrated circuit, comprising first means for detecting a switching condition of said circuit blocks and for driving second means for forcedly activating internal enable signals of the integrated circuit depending on said external enable signals, in order to forcedly maintain said internal enable signals activated during said switching of said circuit blocks.

Thanks to the present invention, it is possible to prevent spurious variations of the levels of the external enable signals of the integrated circuit, caused by noise generated by the switching of some circuit blocks of the same integrated circuit, from affecting the internal enable signals of the integrated circuit.

DETAILED DESCRIPTION OF THE PREFERRED EMBODIMENTS

These and other features and advantages of the present invention will be made apparent by the following detailed description of two particular embodiments thereof, illustrated as non-limiting examples in the annexed drawings, wherein:

FIG. 2 is a circuit diagram of some blocks of the circuit of FIG. 1;

FIG. 3 is a circuit diagram of some other blocks of the circuit of FIG. 1;

DETAILED DESCRIPTION

In the following, two embodiments of a circuit according to the present invention will be described. The two embodiments relate to circuits particularly suitable for being integrated in memory devices, such as ROMs, EPROMs, EEPROMs and Flash EEPROMs.

Figure 1:
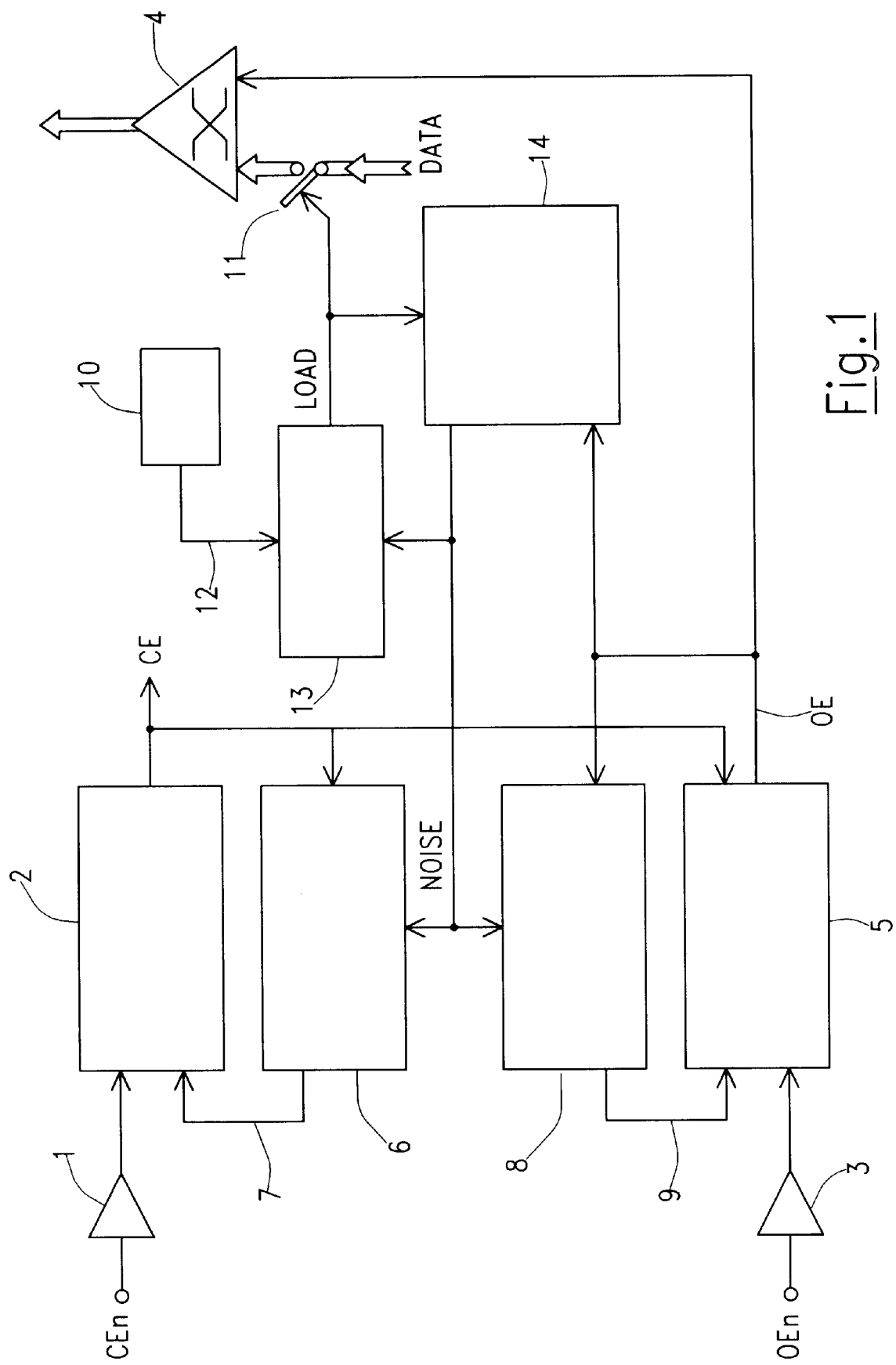
FIG. 1 is a block diagram of a circuit according to a first embodiment of the present invention.

Referring to FIG. 1, there is shown a block diagram of a circuit according to a first embodiment of the present invention. The circuit is integrated in a memory device, for example a ROM, an EPROM, an EEPROM or a Flash EEPROM, which conventionally comprises an array of memory cells, circuits for selecting the memory cells inside said array, circuits for sensing the addressed memory cells and which are not shown in the drawings because they are well known in the art. In the drawing there is shown an input buffer 1 supplied by an external control signal CEn for enabling/disabling the memory device wherein the circuit of the present invention is integrated. Buffer 1 conventionally restores the voltage level of the external signal CEn, raising it to voltage levels corresponding to those typical of the CMOS logic family (typically 0V and 5V or 0V and 3V). Input buffer 1 supplies a block 2 that generates an internal control signal CE controlling the enabling/disabling of the memory device. When signal CE is at the "0" logic level the memory device is disabled, that is it is in a stand-by condition; when instead signal CE is at the "1" logic level, the memory device is enabled and can be accessed.

Similarly, an input buffer 3 is supplied by an external control signal OEn for enabling/disabling output data buffers 4 of the memory device. Buffer 3 has functions similar to those of buffer 1, and supplies a block 5 that generates an internal control signal OE supplying output data buffers 4 so as to determine their activation/deactivation. Deactivation of signal OE ("0" logic level) puts output data buffers 4 in a high-impedance condition, so that the external data bus outside the memory device to which the output signals of buffers 4 are connected can be assigned to other devices of an electronic circuit comprising the memory device.

Signal CE also supplies a block 6 which in turn generates a control signal 7 for block 2; and block 6 is further supplied with a signal NOISE to be described later on.

Similarly, signal OE supplies a block 8 which in turn generates a control signal 9, for block 5; and block 5 is further supplied with the signal NOISE. Block 5 is also supplied with the signal CE generated by block 2.

A block 10 is also shown representing a circuit for generating internal timing signals for controlling the internal operating modes of the memory device, for example, the read operations. Block 10 generates, among others, a timing signal 12 supplying a block 13 that in turn generates a signal LOAD. Signal LOAD drives switches 11 so that when, at the end of a read operation, the data read from the addressed memory cells are put on internal data lines DATA of the memory device (typically the output signals of the memory cell sensing circuits). Activation of signal LOAD causes buffers 4 to be connected to said internal data lines DATA, so that the read data can be transferred to the output buffers 4 and hence to the external data bus outside the memory device.

Signal LOAD supplies a block 14, also supplied by signal OE, generating the aforementioned signal NOISE. Block 14 works substantially as a monostable circuit that generates a pulse of prescribed length, preferably independent from the particular working conditions, when signal OE or signal LOAD is activated. In other words, the monostable circuit in block 14 is triggered by a signal forming the logic OR of signals LOAD and OE. Signal NOISE also supplies block 13.

In FIG. 2 the circuit diagram of some of the blocks of FIG. 1 is shown, more particularly blocks 2 and 6. The output signal of input buffer 1 supplies a transfer gate 15 which in turn supplies an inverter 16, the output thereof forming signal CE. Transfer gate 15 is controlled by signal 7 generated by block 6. Signal 7 also controls an N-channel MOSFET M1 connected between the input of inverter 16 and ground. Signal CE supplies an input of a set-reset flip-flop 17, whose other input is supplied by signal NOISE. An output Q1 of flip-flop 17 and signal NOISE supply an AND gate 18 the output of which forms signal 7.

FIG. 3 similarly shows the circuit diagram of blocks 5 and 8 of FIG. 1. The output signal of input buffer 3 supplies an input of an OR gate 21 whose other input is supplied with the logic complement of signal CE. The output of OR gate 21 supplies a transfer gate 19 that is in turn supplying an inverter 20, the output thereof forming signal OE. Transfer gate 19 is controlled by signal 9 generated by block 8. Signal 9 also controls an N-channel MOSFET M2 connected between the input of inverter 20 and ground. Signal OE supplies an input of a set-reset flip-flop 22, the other input of which is supplied by signal NOISE. An output Q2 of flip-flop 22 and signal NOISE supply an AND gate 23 whose output forms signal 9.

Figure 4:
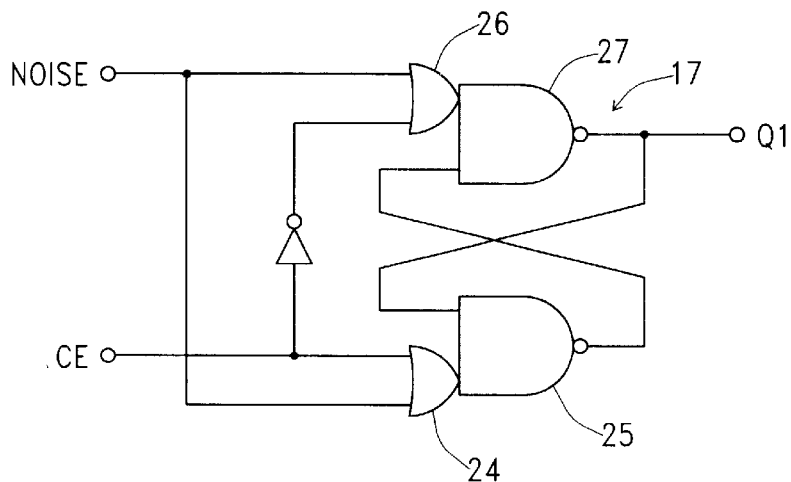
FIG. 4 is a circuit diagram of a flip-flop schematically shown in FIGS. 2 and 3.

The circuit diagram of flip-flop 17 is shown in FIG. 4. Flip-flop 22 is identical. Signals CE and NOISE supply a NOR gate 24 whose output thereof supplies an input of a NAND gate 25. Signal NOISE and the logic complement of signal CE supply an OR gate 26 whose output supplies an input of a NAND gate 27. The output of NAND gate 27, forming signal Q1, supplies the second input of NAND gate 25; and the output of NAND gate 25 supplies the second input of NAND gate 27.

Figure 5:
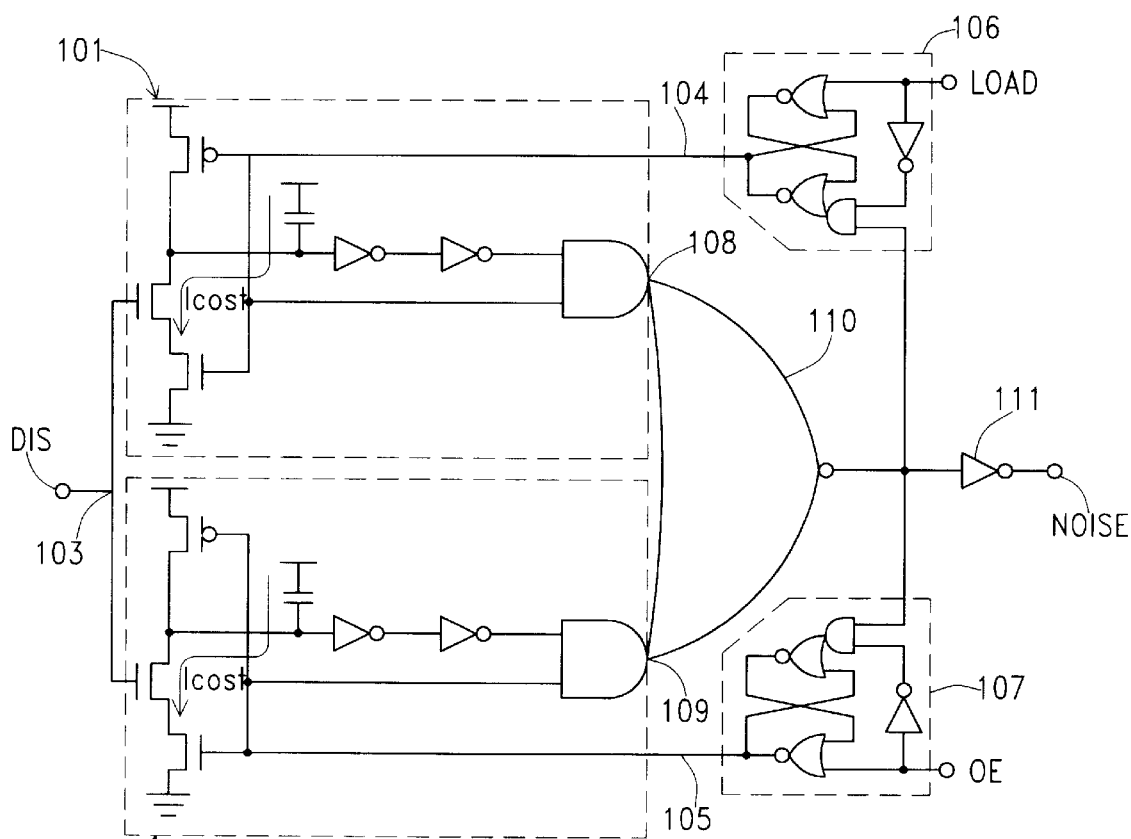
FIGS. 5 and 6 are circuit diagrams of two further blocks of the circuit of FIG. 1.

FIG. 5 shows a detailed circuit diagram of a preferred embodiment of block 14 of FIG. 1, which is the object of the co-pending Italian Patent Application No. MI96A001626 filed on Jul. 30, 1996 in the name of the same Applicant, which is incorporated herein by reference. The circuit comprises first and second pulse delay networks 101 and 102 with a common input terminal 103 and respective control terminals 104 and 105 connected to first and second synchronization blocks 106 and 107, formed by set-reset flip-flops, and respective output terminals 108 and 109 supplying two inputs of a NOR logic gate 110 whose output forms, once complemented by an inverter 111, signal NOISE. Common input terminal 103 is supplied with a signal DIS providing a bias voltage substantially constant independently from variations of the voltage supply of the integrated circuit wherein the circuit according to the invention is integrated. An output of NOR gate 110 further supplies respective inputs of synchronization blocks 106 and 107. These latter have respective trigger terminals supplied with signals LOAD and OE, respectively.

The circuit shown in FIG. 5 generates, at node NOISE, a pulse of "1" logic level having a prescribed duration and substantially independent from the voltage supply when signal OE switches from level "0" to level "1", i.e., the first time the output data buffers 4 are activated. Furthermore, with signal OE at the "1" logic level, the circuit produces at node NOISE a pulse of "1" logic level with said prescribed duration whenever signal LOAD shows a transition from "0" to "1" logic level, that is, whenever a transfer of data on the internal data lines DATA to the output buffers 4 must take place.

Figure 6:
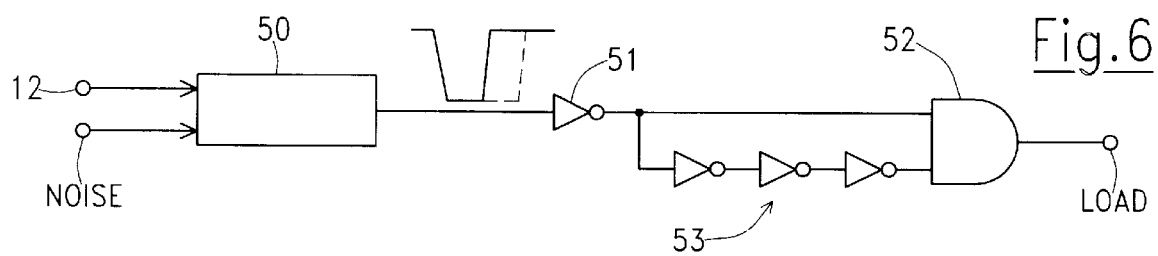

FIG. 6 shows the circuit diagram of block 13 of FIG. 1. Timing signal 12 supplies a trigger input of a monostable circuit 50; monostable circuit 50 also has a disable input 54 supplied with signal NOISE. The output of monostable 50 supplies an inverter 51 which in turn supplies an input of an AND gate 52. The other input of AND gate 52 is supplied by a cascade 53 of three inverters connected to the output of inverter 51. The three inverters 53 and AND gate 52 form a monostable circuit. The output of AND gate 52 forms signal LOAD.

Figure 7:
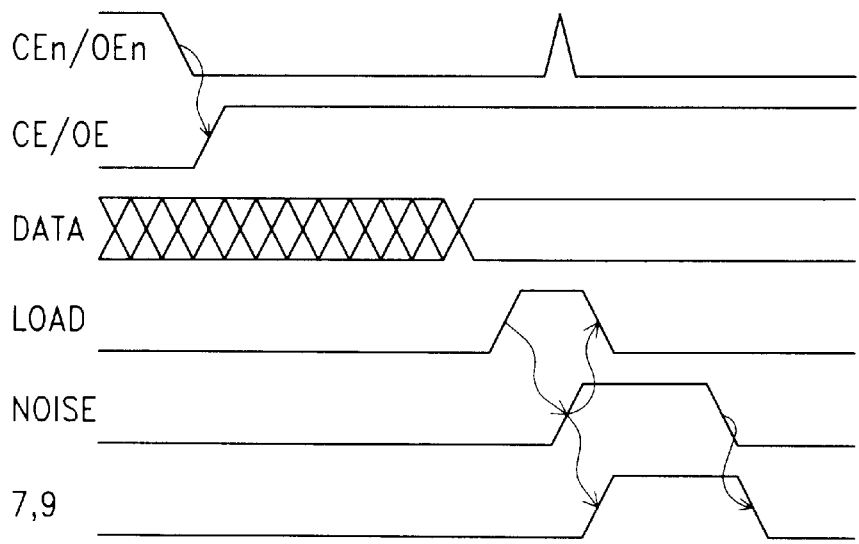
FIG. 7 is a time diagram of some signals of the circuit of FIG. 1.

The working of the circuit previously described will be now explained making reference to the timing diagrams of FIG. 7.

When the memory device is to be accessed for a read operation, the external control signals CEn and OEn are brought to the low logic level ("0"); in this way, the memory device is enabled, and the output data buffers 4 are also enabled. Referring to FIGS. 2, 3 and 4, since signal NOISE is normally at the "0" logic level, signals 7 and 9 are at the "0" logic level, and transfer gates 15 and 19 are enabled. Signals CE and OE are thus brought to the high logic level ("1"). Switching to "1" of signals CE and OE causes flip-flops 17 and 22 to be set, the output signals Q1 and Q2 thereof switching to the "1" logic level. In this way, control of AND gates 18 and 23 is assigned to signal NOISE only.

When at the end of the read operation of the memory device the data read from the memory cells are available on the internal data lines DATA, the timing circuit 10 activates signal 12, and block 13 consequently activates signal LOAD, represented by a pulse of prescribed duration, which causes the lines DATA to be connected to the output data buffers 4 through switches 11. Activation of signal LOAD also causes, by block 14, the activation of signal NOISE. Activation of signal NOISE causes monostable 50 in FIG. 6 to be disabled, so that even if disturbances exist, the generation of other pulses on signal LOAD is prevented. Output data buffers 4 are thus again isolated from the internal data lines DATA. In addition, activation of signal NOISE causes signals 7 and 9 to switch to "1", so that transfer gates 15 and 19 are disabled and MOSFETs M1 and M2 are turned on. In this way, signals CE and OE are forcedly kept at level "1", that is the whole memory device, and output data buffers 4, are forcedly kept enabled, independently of the fact that disturbances generated by switching of the output data buffers 4 causes spurious variations of the voltage values of external signals CEn and OEn. Furthermore, switching to "1" of signal NOISE prevents flip-flops 17 and 22 from being reset by a spurious transition to "0" of signals CE and OE; in other words, it is assured that signals Q1 and Q2 remain at "1" logic level as long as signal NOISE is a "1", and transfer gates 15 and 19 are kept disabled in such a way as to isolate internal signals CE and OE from respective external signals CEn and OEn.

Similar working takes place when signal OEn is activated: also in this case signal NOISE is activated, to keep forcedly activated internal signals CE and OE; this is to prevent disturbances generated as a consequence of the enabling of output buffers (that when exiting the high-impedance condition have to drive the external data lines of the device) that could cause spurious transitions of signals CE and OE.

It is to be understood that the time interval during which signals CE and OE are forcedly kept activated is constant and independent of the supply voltage (thanks to the fact that the duration of signal NOISE is independent of the supply voltage). This is an advantage because if such a time interval depended on the supply voltage, it should be designed in such a way as to assure that its duration is sufficient even at high supply voltages, with the risk that at lower supply voltages it is not possible to respect the time ratings for the memory device.

Figure 8:
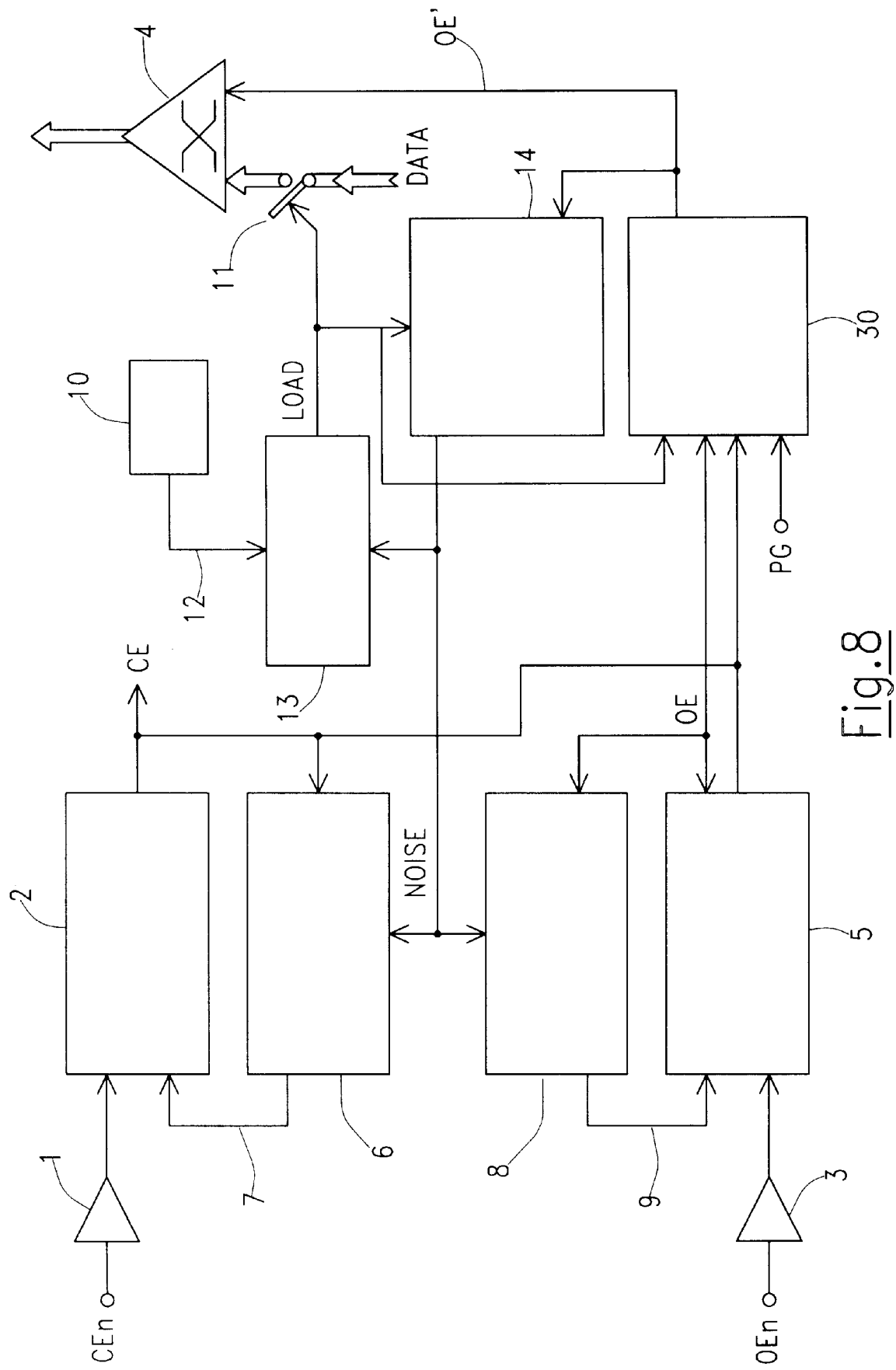
FIG. 8 is a block diagram of a circuit according to another embodiment of the present invention.

FIG. 8 is a block diagram of a circuit according to another embodiment of the present invention, which is a variant of the embodiment shown in FIG. 1. The circuit is substantially identical to that of FIG. 1, with the exception that signal OE generated by block 5 does not control directly the output data buffers 4, but supplies a block 30 which generates a signal OE' that controls enabling/disabling of buffers 4; signal OE' also supplies block 14. Block 30 is further supplied by signal LOAD.

Figure 9:
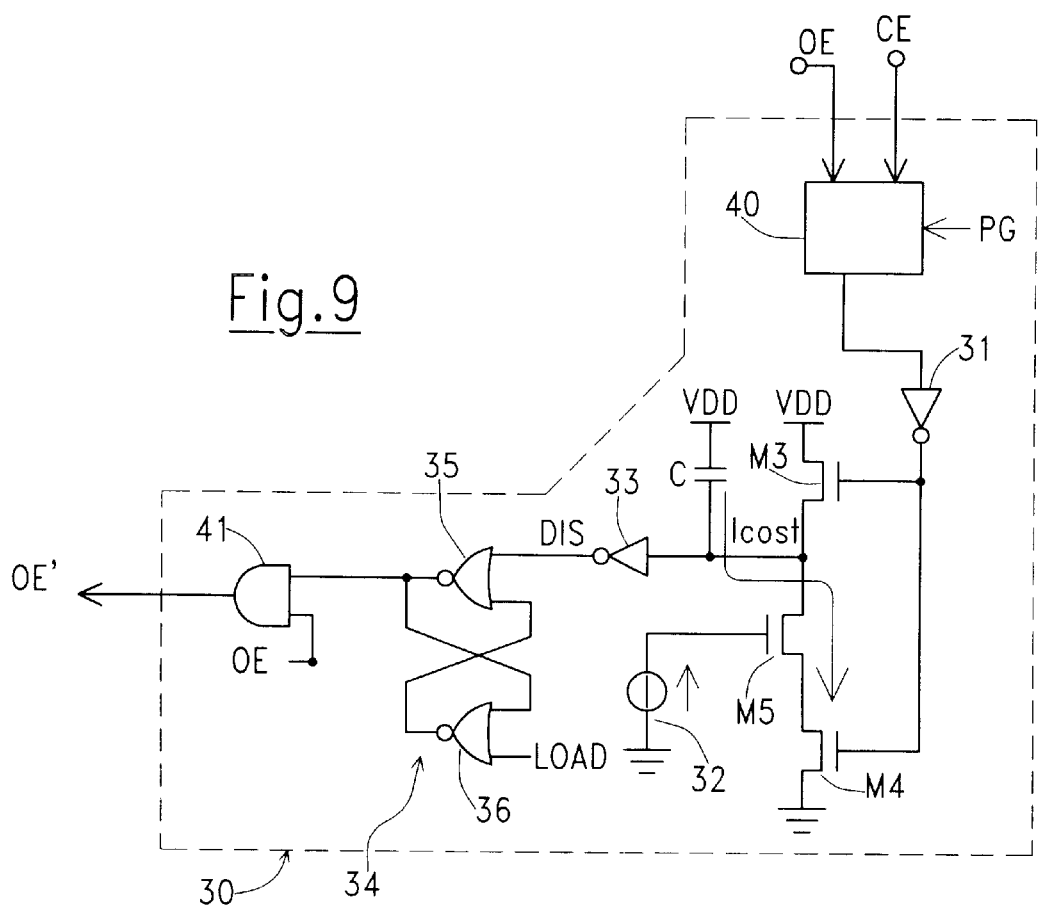
FIG. 9 is a circuit diagram of some blocks of the circuit of FIG. 8.

FIG. 9 shows a detailed circuit diagram of block 30 in FIG. 8. Block 30 comprises a multiplexer 40 supplied with a signal PG that, in normal read mode, is deactivated, and is activated during programming. When signal PG is deactivated, the multiplexer transfers signal CE, while when signal PG is activated (for example, during a program verify operation for verifying the programming condition of the memory cells) the multiplexer transfers signal OE. The output of the multiplexer, after logic complementation by means of an inverter 31, controls a P-channel MOSFET M3 and an N-channel MOSFET M4 serially connected between a voltage supply VDD of the memory device and ground; in series between MOSFETS M3 and M4 there is inserted an N-channel MOSFET M5 driven by a constant gate voltage generated by a bias generator 32. Between the drain terminal of M5 and voltage VDD a capacitor C is inserted; the drain terminal of MS also supplies an inverter 33 having an output DIS supplying a first input of a set-reset flip-flop 34, comprising a NOR gate 35 and a NOR gate 36, the former supplied with signal DIS and the output of NOR gate 36, the latter supplied with signal LOAD and the output of NOR gate 35. The output of NOR gate 35 supplies an input of a NAND gate 41 the other input thereof is supplied with signal OE.

The operation of the circuit of FIG. 8 will be now described.

The main difference between the circuit of FIG. 8 with respect to the one of FIG. 1 resides in the fact that signal OE' which causes enabling of the output data buffers 4 is not activated as soon as the external control signal OEn is activated. As appears from the circuit diagram of FIG. 9, when signal OE is activated in consequence of the activation of the external signal OEn, signal OE' remains deactivated as long as the output of flip-flop 34 is at the "0" logic level. In turn, the output of flip-flop 34 switches to the "1" logic level only synchronously with the signal LOAD going to "1", i.e., the output data buffers 4 are activated only when new data really exist to be transferred to the external data bus of the memory device.

More specifically, when external signal CEn is activated (at the "0" logic level), signal CE is activated ("1" logic level). As already said, signal PG is normally disabled and multiplexer 40 transfers signal CE. MOSFETs M3 and M4 turn on and off, respectively, the input of inverter 33 is brought to the voltage supply VDD, and signal DIS is brought to the "0" logic state. Signal LOAD is normally at the "0" level. Flip-flop 35 is initially set in a state such that the output of NOR gate 35 is at the "0" level. Signal OE' is therefore at the "0" level, and the output data buffers 4 are disabled, that is, they are kept in the high-impedance condition in which they were previously to the activation of signal CEn.

Enabling of the memory device by means of signal CEn starts a read operation of the memory device. When, at the end of such operation, signal LOAD temporarily switches to level "1", flip-flop 34 switches and the output of NOR gate 35 is brought to level "1". If also signal OEn has been activated, then signal OE' is activated, thus enabling the output data buffers 4; the latter transfer the data existent on the internal data lines DATA, supplied through switches 11, to the data bus external to the memory device. If differently signal OEn has not been activated, signal OE' remains deactivated and also the output data buffers 4 remain deactivated.

In this way it is prevented that, when external signal OEn is activated, output data buffers 4 are immediately enabled and, switching to bring to the lines of the external data bus the data stored therein, generate noise on the voltage supply and voltage reference lines which could cause spurious variations of the voltage levels of signals CEn and OEn. Buffers 4 switch only when it is strictly necessary, i.e., when on the internal data lines DATA new data are really present which are to be transferred to the lines of the external data bus.

Block 30 also performs another function, to be now explained. As already described in connection with the first embodiment, during transfer of the data read from the memory cells from the internal data lines DATA to the external data lines, signal OE, as well as signal CE, are forcedly kept activated thanks to the control operated by block 8. In this phase there is no risk that spurious level transitions of the external signals CEn and OEn, caused by noise on voltage VDD or ground in consequence of switching of output buffers 4, affect internal signals CE and OE. In this second embodiment of the invention, block 30 performs a further filtering action of possible spurious pulses on signal CE, for example, deriving from spurious variations of the level of signal CEn after signal NOISE has come back to the "0" level, for example caused by oscillations rising up during switching of output buffers 4.

In fact, when signal CE is brought to logic level "1", capacitor C discharges. If then signal OE is brought back to the "0" level, before signal DIS returns to level "1" it is necessary to wait for the charge of capacitor C by means of a constant current Icost provided by MOSFET M5. Only when the voltage level at the input of inverter 33 will have fallen below its threshold voltage signal DIS will it switch to the "1" level, deactivating signal OE'. By properly choosing the values of capacitor C and current Icost, it is possible to render short pulses of signal OE (having a duration less that a prescribed value) are filtered away.

Even if the description made has concerned circuits according to the invention particularly suitable for being integrated in memory devices, this is not to be intended as a limitation of the present invention, which can find application in any kind of integrated circuit having terminals for external control signals (enabling/disabling). The modifications to be made to the described embodiments are straightforward for the person skilled in the art.

What is claimed is:

1. A circuit for immunizing an integrated circuit from noise affecting external enable signals of the integrated circuit, said noise generated during switching of circuit blocks internal to the integrated circuit, the immunizing circuit comprising: first means for detecting a switching condition of said circuit blocks and for driving second means for forcedly activating internal enable signals of the integrated circuit depending on said external enable signals, in order to forcedly maintain said internal enable signals activated during said switching of said circuit blocks.

2. The immunizing circuit according to claim 1, wherein said second means for forcedly activating the internal enable signals comprise logic circuits with a memory for memorizing an activation condition of said internal enable signals before said switching of said circuit blocks and for allowing to forcedly keep activated said internal enable signals during said switching of the circuit blocks only if, before said switching, the internal enable signals were activated.

3. The immunizing circuit according to claim 2, wherein said integrated circuit is a memory device chip, and said external enable signals comprise a first external signal for enabling the memory device chip, deactivatable for putting the memory device chip in a low power consumption condition, and a second external signal deactivatable for disabling output data buffers supplied by internal data lines of the memory device chip and which drive external data lines.

4. The immunizing circuit according to claim 3, wherein said second means for forcedly activating the internal enable signals further comprise a first forced activation circuit supplied by said first external signal for generating a first internal enable signal depending on said first external signal, and a second forced activation circuit supplied by said second external signal for generating a second internal enabling signal depending on said second external signal.

5. The immunization circuit according to claim 4, wherein said first and second forced activation circuits each comprises a respective logic circuit with memory for memorizing an activation condition of said first and second internal enable signals, respectively, before said switching of the output data buffers, and for allowing, during said switching, the forced activation of said first and second internal enable signals respectively, only if before said switching the first and second internal enable signals were activated.

6. The immunization circuit according to claim 5, further comprising timing circuits for generating a timing signal activated at the switching of the output data buffers for transferring data present on said internal data lines to said external data lines.

7. The immunization circuit according to claim 6, wherein said first means comprises a monostable circuit triggered by said timing signal for activating a forcing signal driving the first and second forced activation circuits in such a way so as during the switching of the output data buffers said first and second internal enable signals are kept activated independently of the state of said first and second external control signals.

8. The immunization circuit according to claim 7, wherein when said forcing signal is activated it drives said logic circuits with memory of said first and second forced activation circuits in such a way so as to prevent them from being reset and losing memory of the activation condition of said first and second internal enable signals before said switching.

9. The immunization circuit according to claim 8, wherein said forcing signal remains activated for a time substantially independent from a value of a voltage supply of the memory device chip.

10. The immunization circuit according to claim 9, wherein said second internal enable signal drives said output data buffers in such a way as to cause one of their enabling/disabling.

11. The immunization circuit according to claim 10, wherein said monostable circuit is triggered also by said second internal enable signal in such a way as said forcing signal is activated also in consequence of the activation of said second external control signal.

12. The immunization circuit according to claim 9, further comprising an enabling circuit for enabling said output data buffers, supplied by said first and second internal enabling signals and by said timing signal and generating a third internal enabling signal determining the enabling of the output data buffers, said third internal enabling signal being activatable in consequence of the activation of said first and second internal enabling signals and said timing signal synchronously with said timing signal.

13. The immunization circuit according to claim 12, wherein said enabling circuit comprises a logic circuit with memory suitable for memorizing an activation condition of said first internal enabling signal and driven by said timing signal for activating, when the second internal enabling signal is activated, said third internal enabling signal synchronously with said timing signal.

14. The immunization circuit according to claim 13, wherein said enabling circuit comprises filtering means for filtering pulses of said first internal enabling signal having a width less than a prescribed width, so that said pulses are not memorized in said logic circuit with memory.

15. A protection circuit for protecting a memory device from spurious noise on an internal control line of the memory device wherein the memory device includes a first input for receiving a first external control signal and a second input for receiving a second external control signal the protection circuit comprising:

a first circuit to receive the first external control signal and to generate a first internal control signal therefrom;

a second circuit to receive the first internal control signal and to output a first circuit control signal to the first circuit;

a third circuit to receive the second external control signal and the first internal control signal to generate a second internal control signal therefrom;

a fourth circuit to receive the second internal control signal and to output a third circuit control signal to the third circuit;

a fifth circuit to generate a load control signal pulse when a read operation of the memory device has been completed; and a sixth circuit to receive the load control signal pulse and the second internal control signal and to generate and output a noise control signal pulse as a function thereof to the fifth circuit and the second and fourth circuits so as to keep each of the first and second internal control signals at a first logic level for a predetermined period of time after a start of the load control signal pulse and to prevent generation of another load control signal pulse during the predetermined period of time.

16. The protection circuit as recited in claim 15, wherein a duration of the noise control signal pulse is not a function of a supply voltage of the memory device.

17. The protection circuit as recited in claim 15, wherein the first circuit generates the first internal control signal as a function of both the first circuit control signal and the first external control signal.

18. The protection circuit as recited in claim 17, wherein the second circuit generates the first circuit control signal as a function of both the noise control signal and the first internal control signal.

19. The protection circuit as recited in claim 15, wherein the third circuit generates the second internal control signal as a function of both the second circuit control signal and the second external control signal.

20. The protection circuit as recited in claim 19, wherein the fourth circuit generates the second circuit control signal as a function of both the noise control signal and the second internal control signal.

21. The protection circuit as recited in claim 20, wherein the sixth circuit comprises a monostable circuit to generate the noise control signal pulse.

22. A method of preventing a spurious transition of a logic level of an external control signal at an input of a memory device from affecting an internal control signal of the memory device, the method comprising steps of:

detecting when a first load control signal pulse has been generated indicating a read operation of the memory device has been completed; and generating a noise control signal pulse in response to the load control signal pulse for a predetermined period of time after a start of the load control signal pulse so as to maintain the internal control signal of the memory device at a first logic level despite the spurious transition of the logic level of the external control signal at the input of the memory device.

23. The method as recited in claim 22, wherein the spurious transition of the logic level of the external control signal causes a spurious pulse signal on the external control signal during the load control signal pulse; and wherein a load control signal generating circuit is prevented by the noise control signal pulse from generating a second load control signal pulse in response to the spurious pulse signal.

24. The method as recited in claim 23, wherein the predetermined period of time of the noise control signal pulse is not a function of a supply voltage of the memory device.

25. A protection circuit for protecting a memory device from a spurious transition of a logic level of an external control signal at an input of a memory device from affecting an internal control signal, the protection circuit comprising:

a first circuit to determine when a first load control signal pulse has been generated indicating a read operation of the memory device has been completed; and a second circuit to generate a noise control signal pulse in response to the load control signal pulse, the noise control signal pulse having a duration for a predetermined period of time after a start of the load control signal so as to maintain the internal control signal at a first logic level despite the spurious transition of the logic level of the external control signal; and wherein the predetermined period of time of the noise control signal pulse is not a function of a supply voltage of the memory device.

26. The protection circuit as recited in claim 25, wherein the first circuit comprises a set-reset flip-flop circuit; and the second circuit comprises first and second pulse delay network circuits.

27. The protection circuit as recited in claim 26, wherein each of the first and second pulse delay network circuits is biased by a bias voltage substantially independent of the supply voltage of the memory device.

* * * * *

UNITED STATES PATENT AND TRADEMARK OFFICE
CERTIFICATE OF CORRECTION

PATENT NO. :   5,903,166
DATED        :   May 11, 1999
INVENTOR(S):   Luigi Pascucci It is certified that error appears in the above-identified patent and that said Letters Patent is hereby corrected as shown below:

On the title page, Item [73] should read:

[73]   Assignee:   SGS-Thomson Microelectronics S.r.l.
                   Agrate Brianza, Italy Signed and Sealed this Twenty-first Day of September, 1999

Attest:

Q. TODD DICKINSON

*Attesting Officer*                *Acting Commissioner of Patents and Trademarks*